(12) United States Patent
Fifield et al.

(10) Patent No.: US 6,452,439 B1
(45) Date of Patent: Sep. 17, 2002

(54) INDUCTIVE VOLTAGE SPIKE GENERATOR WITH DIODE SHUNT

(75) Inventors: John A. Fifield, Underhill, VT (US); Nicholas M. Van heel, Eagle, ID (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/850,353

(22) Filed: May 7, 2001

(51) Int. Cl.[7] ................................................. G05F 1/10
(52) U.S. Cl. ...................................................... 327/536
(58) Field of Search ................................ 327/525, 530, 327/534, 535, 536, 537; 363/59, 60, 61

(56) References Cited

U.S. PATENT DOCUMENTS

| | | | |
|---|---|---|---|
| 5,070,384 A | 12/1991 | McCollum et al. | 357/51 |
| 5,313,141 A * | 5/1994 | Kimball | 315/169.3 |
| 5,418,434 A * | 5/1995 | Kamens et al. | 315/169.3 |
| 5,550,458 A * | 8/1996 | Farrington et al. | 323/222 |
| 5,572,414 A * | 11/1996 | Komori | 363/60 |
| 5,633,579 A * | 5/1997 | Kim | 323/222 |
| 5,821,701 A * | 10/1998 | Teggatz et al. | 315/169.3 |
| 5,841,299 A | 11/1998 | De | 326/98 |
| 5,923,153 A * | 7/1999 | Liu | 323/222 |
| 5,943,200 A * | 8/1999 | He | 361/113 |
| 5,986,476 A | 11/1999 | De | 326/98 |
| 6,100,729 A | 8/2000 | Nagano et al. | 327/112 |
| 6,154,380 A * | 11/2000 | Assow et al. | 363/61 |
| 6,204,609 B1 * | 3/2001 | Kimball | 315/169.3 |
| 6,307,359 B1 * | 10/2001 | Uchida | 323/282 |
| 6,348,818 B1 * | 2/2002 | Filipovski | 326/88 |

* cited by examiner

Primary Examiner—Jeffrey Zweizig
(74) Attorney, Agent, or Firm—DeLio & Peterson LLC; Peter W. Peterson; Howard J. Walter, Jr.

(57) ABSTRACT

A voltage generator for an integrated circuit chip comprises an integrated circuit chip with a power supply having a voltage available to the chip; an inductor on or in contact with the integrated circuit chip electrically connected to the power supply through which current is driven; and a clock adapted to interrupting current flowing from the power supply through the inductor at desired time intervals to create voltage spikes above the power supply voltage. The inductor may comprise a portion of the lead frame connecting the integrated circuit chip to an integrated chip package. The voltage spikes generate a voltage about two or more times the voltage of the power supply available to the chip. Where the integrated circuit chip includes an electrical fuse and/or a battery, the fuse on the chip may be adapted to be programmed or the battery charged by the voltage spikes.

20 Claims, 3 Drawing Sheets

INDUCTIVE VOLTAGE SPIKE GENERATOR WITH DIODE SHUNT

BACKGROUND OF THE INVENTION

1. Field of the Invention

The present invention relates to a method and system for generating voltages higher than those available from the power supply to an integrated circuit (IC) chip.

2. Description of Related Art

Oxide-type electronic fuses or antifuses have recently been introduced into semiconductor technology, and can require a programming voltage which is higher than the power supply voltage ($V_{ext}$) normally available to and used by the integrated circuit chip. Antifuse programming is typically done at manufacturing test and may require a high voltage generator to function for 10 seconds or less. Most chips have been traditionally powered by a 5 v power supply, and such power supply voltages are now moving to lower, to the approximately 3 v range, e.g., 3.3 v and as low as 2.7 v. The voltage that is needed to program antifuses is about 6–10 v. These high voltages need to be supplied either from a source off-chip, e.g., by way of a special pin, which has its own set of problems, or by generating the voltage from a source on-chip. High voltage can be supplied from off-chip but requires special electrostatic device (ESD) protection circuits to admit voltage levels usually shunted by conventional ESD devices. While an oscillator and multi-stage pump may be used to generate 10 v on-chip, such a device requires a relatively large amount of area on-chip, which is not desirable.

In addition to generating a voltage to program electrical fuses, other specific applications may need higher voltages than those available on-chip, such as generating a reference voltage, providing a means to charge a battery and any application that would require a higher voltage that uses low power. It would be advantageous to be able to generate voltages on an integrated circuit chip that are 2–4 times the voltage available from the normal chip power supply, and to do so with a compact device.

Bearing in mind the problems and deficiencies of the prior art, it is therefore an object of the present invention to provide a method and system for generating voltages on an integrated circuit chip which are higher than those available on-chip from the chip power supply.

It is another object of the present invention to provide a system for generating higher voltages on an integrated circuit chip which is relatively compact.

A further object of the invention is to provide a method and system for generating higher voltages on an integrated circuit chip which may be used to program antifuses.

It is yet another object of the present invention to provide a method and system for generating higher voltages on an integrated circuit chip which may be used for higher voltage applications that use low power.

Still other objects and advantages of the invention will in part be obvious and will in part be apparent from the specification.

SUMMARY OF THE INVENTION

The above and other objects and advantages, which will be apparent to one skilled in the art, are achieved in the present invention which is directed to, in a first aspect, a method of generating higher voltage on an integrated circuit chip from a power supply available to the chip comprising providing an inductor on or in contact with the integrated circuit chip; driving current from the power supply through the inductor; and interrupting the current through the inductor at desired time intervals to create voltage spikes above the power supply voltage.

Preferably, the integrated circuit chip includes a lead frame connecting the integrated circuit chip to an integrated chip package, and the inductor comprises a portion of the lead frame. The current may be driven through a plurality of transistors on the integrated circuit chip, and a clock may be connected to one of the transistors to interrupt the current. The method may further include rectifying, collecting and storing the voltage spikes on a capacitor and rectifier disposed on the integrated circuit chip.

In operation, positive and negative voltage spikes are created by interrupting the current, and the method may further include employing diodes on the integrated circuit chip to shunt away the negative spikes to ground. A stacked diode clamp on the integrated circuit chip may be used to limit the higher voltage generated. The voltage spikes may generate a voltage about two or more times the voltage of the power supply available to the chip. The integrated circuit chip may include an electrical fuse and/or a battery, and the higher voltage generated by the voltage spikes may be used to program the fuse on the chip and/or charge the battery.

In a related aspect, the present invention is directed to a voltage generator for an integrated circuit chip comprising an integrated circuit chip with a power supply having a voltage available to the chip; an inductor on or in contact with the integrated circuit chip electrically connected to the power supply through which current is driven; and a clock adapted to interrupting current flowing from the power supply through the inductor at desired time intervals to create voltage spikes above the power supply voltage.

Preferably, the integrated circuit chip includes a lead frame connecting the integrated circuit chip to an integrated chip package, and the inductor comprises a portion of the lead frame. The voltage generator may further include transistors disposed on the integrated circuit chip and connected to the inductor through which current is driven, and the clock may be connected to one of the transistors to interrupt the current driven through the transistors. The voltage generator may also include a capacitor and rectifier disposed on the integrated circuit chip adapted to collect and store the voltage spikes. Diodes disposed on the integrated circuit chip may be adapted to shunt away to ground negative voltage spikes created by interrupting the current, and a stacked diode clamp disposed on the integrated circuit chip may be adapted to limit the higher voltage generated. The voltage spikes generate a voltage bout two or more times the voltage of the power supply available to the chip. Where the integrated circuit chip includes an electrical fuse and/or a battery, the fuse on the chip may be adapted to be programmed and/or the battery may be charged by the higher voltage generated by the voltage spikes.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
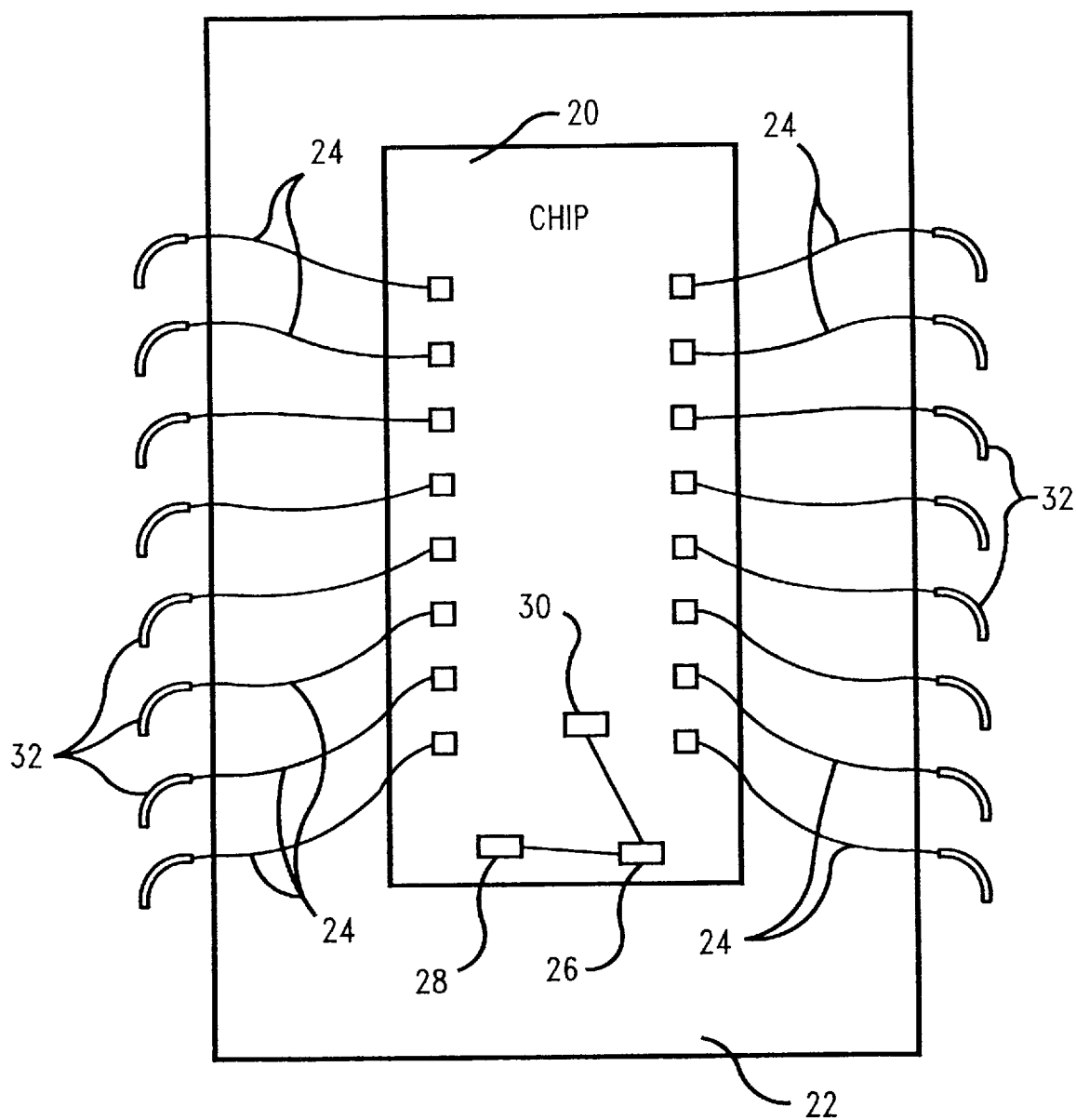
FIG. 1 is a top plan view of an integrated circuit chip showing the lead frame and the inductive voltage spike generator of the present invention.

In describing the preferred embodiment of the present invention, reference will be made herein to FIGS. 1–3 of the drawings in which like numerals refer to like features of the invention. Features of the invention are not necessarily shown to scale in the drawings.

The present invention is directed to a method and system to create on an integrated circuit chip an inductive-voltage spike that has a peak amplitude several volts above the chip power supply voltage. Once generated, this high voltage may be applied numerous times to the oxide of an anti-fuse to program a specific fuse element, or it may be used for other applications requiring voltages 2–4 times those of a conventional chip power supply.

The preferred embodiment of the present invention utilizes a circuit which is intended to input a clock signal CLK, which modulates current through an inductor to develop a high voltage across the inductor in accordance with the relationship:

$$V_L = L(di/dt)$$

where $V_L$ is the voltage generated across the inductor utilized, L is the inductance of the inductor, i is current, and t is time. The inductance can be from an 8–10 nh thin small outline package (TSOP) lead frame inductor, or from an inductor fabricated on-chip, as disclosed in "On-Chip Spiral Inductors . . . " from 1987 digest of Tech. Papers, Symposium on VLSI circuits, p. 12-1. Once the high voltage is developed on an internal node, it may be rectified and directed to a stack of filter caps, and used to program e-fuse elements. Additionally, the preferred embodiment of the present invention utilizes existing lead frame inductance on the integrated circuit chip package as one of its components.

As shown in FIG. 1, an integrated circuit chip 20 is fabricated on silicon and is subsequently packaged into a plastic or ceramic package 22 by some connection means, which is usually referred to as a lead frame or wire bond 24, which leads to package pins 32. Typically, the lead frame is a metal frame of high permeability nickel-iron construction, e.g., Alloy 42, upon which the chip sits. Because it usually has a high level of inductance which limits the chip upper frequency response, it has been problematic and is therefore considered to be parasitic. In accordance with the present invention, the inductance in such a lead frame may be employed in a useful manner by utilizing its inductive properties to generate higher voltages directly on the integrated circuit chip. The use of the lead frame inductor is particularly advantageous because integrated circuits do not normally have a convenient way to fabricate an inductor since the wires are made of aluminum, and the distance from the wiring to the ground plane is so small. The existing lead frame can provide suitable inductance without using additional chip area.

In the present invention, current is forced through a portion of the lead frame and then interrupted to create a change in current, di/dt. This then results in an inductively generated high voltage spike, which is then rectified and filtered using IC components. Each individual spike may last only on the order of 1 ns, so that hundreds if not thousands of these spikes are repeatedly generated and rectified to charge a capacitor, which stores the high voltage. These components and circuits may be contained in an on-chip generator 26 located in a relatively small area on chip 20.

To prevent voltage oxide stress on transistors that were designed at a particular lower voltage, e.g., 3–4 v, stacking techniques are used to keep voltage oxide stress low. Voltage oxide stress is known to occur because each transistor has a particular gate oxide thickness, which cannot tolerate voltage above a certain level. This may be specified by a limit in megavolts per centimeter that the oxide can withstand, and is typically 5 mv/cm for most technologies. The present invention utilizes two or more of these transistors in series such that the voltage is shared across the two components rather than building up across one and subjecting it to overstress. By using this technique oxide stress problems are avoided, while still generating high voltage useful for such applications as high voltage references in low power circuits, or providing a high voltage for antifuse programming. Antifuse elements 28 may be programmed using the high voltage generated by the present invention. Additionally, such high voltage may be used to charge a rechargeable battery 30 also disposed on the chip.

Figure 2:
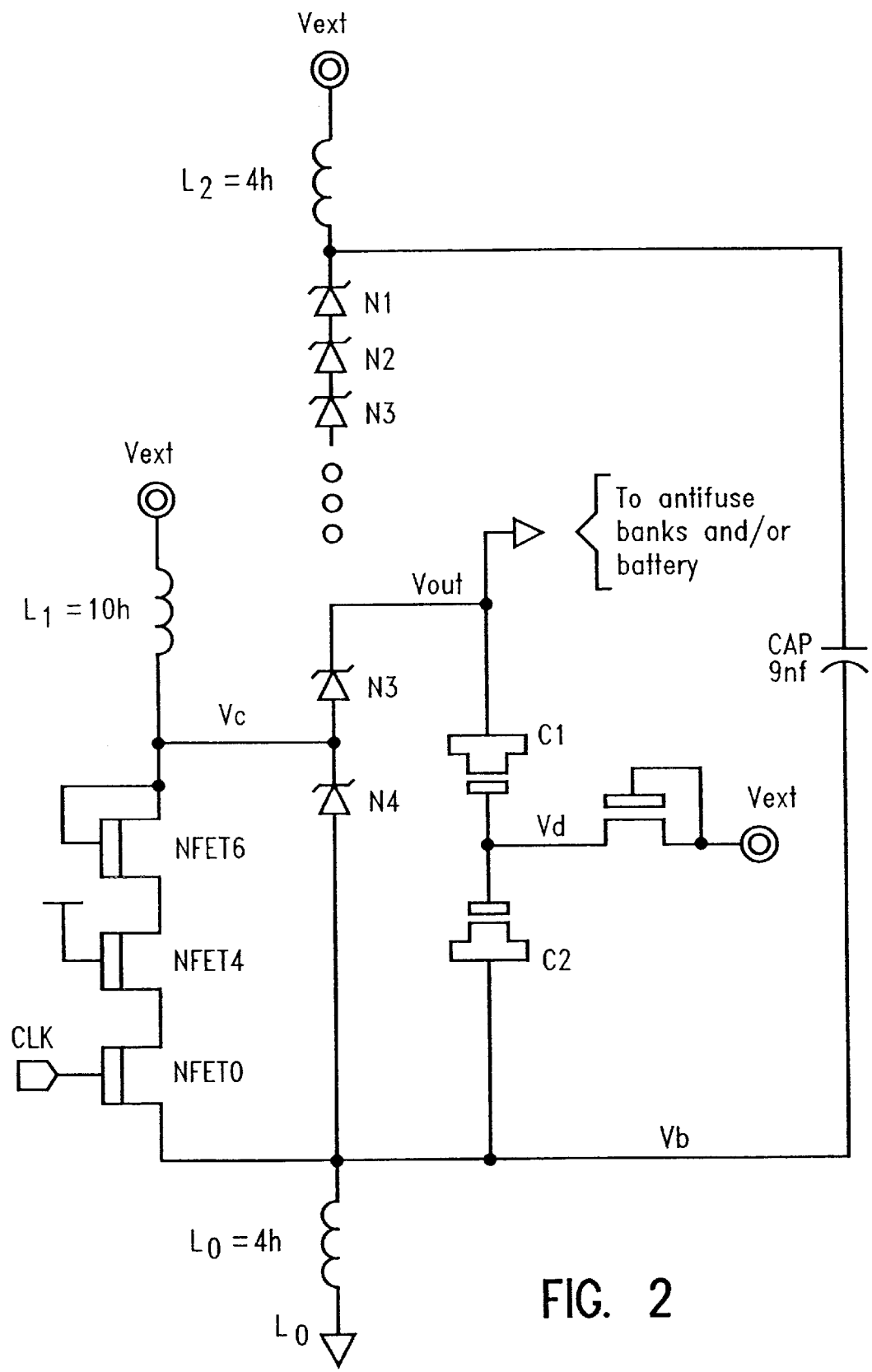
FIG. 2 is a circuit diagram of the inductive voltage spike generator of the present invention.

FIG. 2 shows the circuit diagram of the preferred embodiment on-chip generator of the present invention. Current flow is established by inductor $L_1$ which is formed by lead frame inductor 24 on IC package 22 (FIG. 1). In the example shown, $L_1$=10 n. Current flow is established through $L_1$ from the external power supply $V_{ext}$ which is 2.7 volts in this example. The current then flows down through vertically stacked transistors NFET 6, NFET 4 and NFET 0, down to bottom inductor $L_0$, and down to ground. The bottom inductor $L_0$ is also formed by lead frame 24 and is basically a parasitic element, as is the top inductor L2 which is also an artifact of lead frame 24. In the example shown, $L_0$=$L_2$=4 n. A clock input CLK is connected to the gate of NFET 0.

The operation of the on-chip generator is established by turning clock input CLK on and establishing a current flow through L1, NFET 6, NFET 4, NFET 0 and $L_0$. Then clock input CLK is rapidly shut off. This is repeated for a desired time interval to create di/dt. In response to this changing current, voltage spikes greater than $V_{ext}$ are created on node $V_c$, i.e., when the electromagnetic field collapses in inductor $L_1$ voltage $V_c$ has voltage spikes appear on it as a result of changing current. $V_c$ is therefore a high voltage node.

The inductor will generate both a positive spike and a negative spike in response to either a positive change in current or a negative change in current. Connected to $V_c$, diode N4 passes the positive voltage spikes onto collection capacitors $C_1$ and $C_2$. These collection capacitors are shown as transistors that have their source drains tied together, with a voltage node $V_d$ in between. As positive voltage spikes that occur on $V_c$ are passed through diode N4 to node $V_{out}$, the charges are integrated on capacitors $C_1$ and $C_2$. While the voltage occurring on $V_{out}$ may be high enough to cause oxide stress problems if passed through a single one of these transistors, because there are a pair of stacked transistor (capacitor) elements forming a voltage divider, the $V_{out}$ voltage is divided in half and oxide stress is maintained below acceptable limits. Diode NFET 3 is connected on one side to $V_{ext}$ and on the other side between $C_1$ and $C_2$, such that at power up voltage $V_d$ will be no lower than a diode drop below $V_d$, i.e., no less than $V_{ext}$ minus the threshold drop. This also aids in preventing an oxide stress.

When the direction of the current flow is interrupted so that it creates a negative spike, diode N5 is provided between $V_c$ and $L_0$ to short circuit or to shunt way the negative spikes to ground. In other words, when node $V_c$ goes below round, diode N5 conducts and clamps node $V_c$ to a diode voltage below ground.

The voltage which is generated on $V_c$ can be varied and is proportional to what may be an unknown inductance. Additionally, it may be difficult to predict di/dt through the inductor, and the corresponding node voltage on $V_c$, and $V_{out}$. This may result in situations where $V_{out}$ can be sufficiently high to create an oxide stress and over-voltage. To accommodate this potential problem, the present invention provides a stack of diodes connecting $V_{out}$ to the power supply $V_{ext}$. The result is that $V_{out}$ cannot rise more than N diode voltage drops higher than the power supply. Diodes N1, N2 and N3 are shown in series between inductor $L_2$, connected to $V_{ext}$ and $V_{out}$. The dots signify the possibility of additional diodes. Any number of diodes may be used, depending on the maximum voltage desired. These stacked diodes provide a clamping mechanism to prevent over-voltage. If a diode drop is 0.65 v and ten diodes are employed in series, the maximum voltage of $V_{out}$ will be 6.5 v above $V_{ext}$. Other diodes may be used for other maximum voltages. For example, if the antifuses blow at 8 or 9 v, there would be no need to generate a voltage onto $V_{out}$ greater than 10 or 11 v. One may calculate from the technology specifications how much voltage the components can withstand, so that the stacked diode clamping circuit would leave the voltage high enough for the application use, but not so high that it would cause reliability problems.

Additionally, there is provided an optional capacitor CAP to simulate typical on-chip capacitances between the power supply and ground. While it may be useful in a simulation to demonstrate operability, it is not an essential part of the invention.

Figure 3:
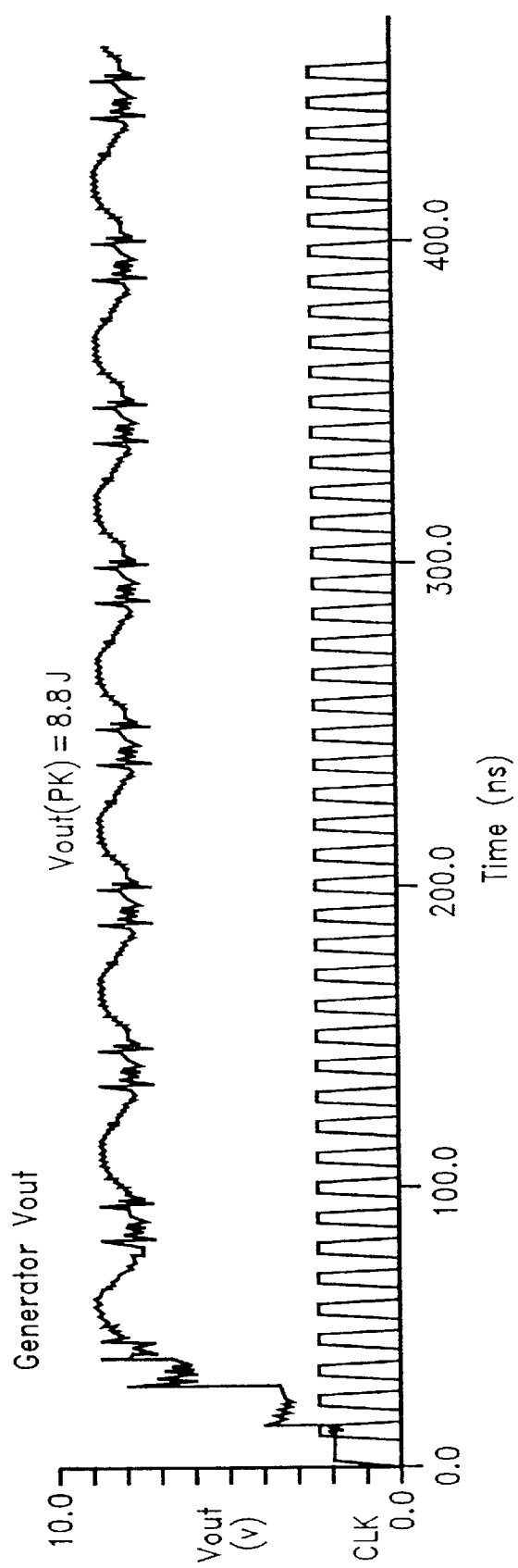
FIG. 3 is a graphical representation of the high voltage $V_{out}$ generated by the inductive voltage spike generator of the present invention.

FIG. 3 is a graphical representation of the voltage output $V_{out}$ of the high-voltage generator of the present invention as a function of numbers of clock pulses, operating from a $V_{ext}$ of 2.7 v. The horizontal scale shows time in nanoseconds, with the clock CLK pulse shown at the lower portion of the graph, and the vertical scale is in volts. The clock pulse rate is approximately 5 ns on and 5 ns off, which creates di/dt and the voltage spike through the inductor. The resulting output voltage $V_{out}$ has oscillations in it, at basically two frequencies. The low frequency wave has a voltage range between about 7 v and 9 v. This low frequency wave is in response to the resonance created between on-chip capacitance and inductance. Additionally, it should be noted that $V_{out}$ in FIG. 2 is referenced to simple external ground. The actual on-chip voltage will be smoother because in use it is referenced to on-chip ground $V_b$(FIG. 2).

Thus, the preferred circuit of the present invention employs voltage limiting done with PN diodes to prevent large negative spikes from causing forward biased junctions. Maximum voltage limits can also be regulated by a diode stack clamping mechanism. The present invention may be used to program antifuses, such as those disclosed in U.S. Pat. No. 5,070,384, the disclosure of which is hereby incorporated by reference. Lab measurements of programming an antifuse on present technology show successful programming with as little as 6-µa, and therefore a high current capacity is not required.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of generating higher voltage on an integrated circuit chip from a power supply available to the chip comprising:
   providing an integrated circuit chip with a power supply having a voltage available to the chip;
   providing an inductor on or in contact with the integrated circuit chip;
   driving current from the power supply through the inductor;
   interrupting the current through the inductor at desired time intervals to create voltage spikes above the power supply voltage; and
   shunting negative voltage spikes to ground through diodes.

2. The method of claim 1 wherein the integrated circuit chip includes a lead frame connecting the integrated circuit chip to an integrated chip package, and wherein the inductor comprises a portion of the lead frame.

3. The method of claim 1 wherein the current is driven through a plurality of transistors, and a clock is connected to one of the transistors to interrupt the current.

4. The method of claim 3 wherein the transistors are disposed on the integrated circuit chip.

5. The method of claim 1 further including rectifying, collecting and storing the voltage spikes on a capacitor.

6. The method of claim 5 wherein the capacitor and rectifier are disposed on the integrated circuit chip.

7. The method of claim 1 wherein the diodes are disposed on the integrated circuit chip.

8. The method of claim 1 further including a stacked diode clamp to limit the higher voltage generated.

9. The method of claim 8 wherein the stacked diode clamp is disposed on the integrated circuit chip.

10. The method of claim 1 wherein the voltage spikes generate a voltage about two or more times the voltage of the power supply available to the chip.

11. The method of claim 1 wherein the integrated circuit chip includes an electrical fuse, and further including using the higher voltage generated by the voltage spikes to program the fuse on the chip.

12. The method of claim 1 wherein the integrated circuit chip includes a battery, and further including using the higher voltage generated by the voltage spikes to charge the battery on the chip.

13. A voltage generator for an integrated circuit chip comprising:
   an integrated circuit chip with a power supply having a voltage available to the chip;
   an inductor on or in contact with the integrated circuit chip electrically connected to the power supply through which current is driven;
   a clock adapted to interrupting current flowing from the power supply through the inductor at desired time intervals to create voltage spikes above the power supply voltage; and
   diodes disposed on the integrated circuit chip adapted to shunt away to ground negative voltage spies created by interrupting the current.

14. The voltage generator of claim 13 wherein the integrated circuit chip includes a lead frame connecting the integrated circuit chip to an integrated chip package, and wherein the inductor comprises a portion of the lead frame.

15. The voltage generator of claim 13 further including transistors disposed on the integrated circuit chip and connected to the inductor through which current is driven, and wherein the clock is connected to one of the transistors to interrupt the current driven through the transistors.

16. The voltage generator of claim 13 further including a capacitor and rectifier disposed on the integrated circuit chip adapted to collect and store the voltage spikes.

17. The voltage generator of claim 13 further including a stacked diode clamp disposed on the integrated circuit chip adapted to limit the higher voltage generated.

18. The voltage generator of claim 13 wherein the voltage spikes generate a voltage about two or more times the voltage of the power supply available to the chip.

19. The voltage generator of claim 13 wherein the integrated circuit chip includes an electrical fuse, the fuse on the chip adapted to be programmed by the higher voltage generated by the voltage spikes.

20. The voltage generator of claim 13 wherein the integrated circuit chip includes a battery, the battery on the chip adapted to be charged by the higher voltage generated by the voltage spikes.

* * * * *